US009257289B2

(12) United States Patent
Leobandung et al.

(10) Patent No.: US 9,257,289 B2
(45) Date of Patent: Feb. 9, 2016

(54) LOWERING PARASITIC CAPACITANCE OF REPLACEMENT METAL GATE PROCESSES

(71) Applicant: International Business Machines Corporation, Armonk, NY (US)

(72) Inventors: Effendi Leobandung, Stormville, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 134 days.

(21) Appl. No.: 14/197,959

(22) Filed: Mar. 5, 2014

(65) Prior Publication Data

US 2015/0255294 A1    Sep. 10, 2015

(51) Int. Cl.
*H01L 21/22* (2006.01)
*H01L 21/28* (2006.01)
*H01L 29/49* (2006.01)
*H01L 29/51* (2006.01)

(52) U.S. Cl.
CPC ...... *H01L 21/28088* (2013.01); *H01L 29/4966* (2013.01); *H01L 29/517* (2013.01)

(58) Field of Classification Search
CPC ............ H01L 21/022; H01L 21/02172
See application file for complete search history.

(56) References Cited

U.S. PATENT DOCUMENTS

| 7,148,099 | B2 | 12/2006 | Datta et al. |
| 7,585,716 | B2 | 9/2009 | Cheng |
| 7,812,411 | B2 | 10/2010 | Cheng |
| 8,652,956 | B2 * | 2/2014 | Beyer ................ H01L 29/42376 |
| | | | 257/E21.19 |
| 2009/0289365 | A1 * | 11/2009 | Yang ................. H01L 21/76846 |
| | | | 257/751 |
| 2010/0006955 | A1 | 1/2010 | Takimoto |
| 2012/0043623 | A1 | 2/2012 | Doris et al. |

OTHER PUBLICATIONS

Kikuchi, et al., "Anisotropic high-k deposition for gate-last processing of metal-oxide-semiconductor field-effect transistor utilizing electron-cyclotron-resonance plasma sputtering", Thin Solid Films, Nov. 2011, 2989-2933, 520, Elsevier B.V.

* cited by examiner

*Primary Examiner* — Mohammad Choudhry
(74) *Attorney, Agent, or Firm* — Scully, Scott, Murphy & Presser, P.C.; Louis J. Percello

(57) ABSTRACT

The present disclosure provides a method of forming a gate structure of a semiconductor device with reduced gate-contact parasitic capacitance. In a replacement gate scheme, a high-k gate dielectric layer is deposited on a bottom surface and sidewalls of a gate cavity. A metal cap layer and a sacrificial cap layer are deposited sequentially over the high-k gate dielectric layer to form a material stack. After ion implantation in vertical portions of the sacrificial cap layer, at least part of the vertical portions of the material stack is removed. The subsequent removal of a remaining portion of the sacrificial cap layer provides a gate component structure. The vertical portions of the gate component structure do not extend to a top of the gate cavity, thereby significantly reducing gate-contact parasitic capacitance.

14 Claims, 5 Drawing Sheets

LOWERING PARASITIC CAPACITANCE OF REPLACEMENT METAL GATE PROCESSES

BACKGROUND

The present disclosure relates to a semiconductor structure and a method of forming the same. More particularly, the present disclosure relates to a metal oxide semiconductor field effect transistor (MOSFET) having a high performance replacement gate structure with reduced gate-contact parasitic capacitance, and methods of manufacturing the same.

Since its first implementation in 45 nm technology node, a high-k metal gate stack including a high-k gate dielectric (i.e., a gate dielectric having a dielectric constant of greater than 3.9, typically greater than 7.0) and a metal gate has become a common process platform in advanced complementary metal oxide semiconductor (CMOS) devices.

One of the process schemes for fabricating a high-k/metal gate MOSFET is a replacement gate method. In a replacement gate process, a MOSFET can be fabricated using a disposable gate structure. In such a process, the disposable gate structure is formed first and thereafter the disposable gate structure is replaced by a gate stack including a high-k gate dielectric and a gate electrode. Since the gate stack including the high-k gate dielectric and the gate electrode is formed after high temperature processing steps such as a source/drain activation anneal, the replacement gate process has the advantage of minimal damage on the high-k gate dielectric and the gate electrode. Moreover, a wide range of metals can be selected for the gate electrode.

Because the high-k gate dielectric and the gate electrode "replace" the disposable gate structure by filling a U-shaped recessed region, i.e., gate cavity, formed after removal of the disposable gate structure, the high-k gate dielectric follows the contour of the recessed region. The presence of a high-k dielectric material on the sidewalls of the U-shaped recess results in a significant parasitic capacitance between the gate electrode and the source and drain regions of a replacement gate MOSFET, thereby adversely impacting the performance of the replacement gate MOSFET.

Further, replacement gate MOSFETs typically employ a work function metal portion in each gate electrode such that the work function metal portion contacts the high-k gate dielectric. The work function metals, however, have a greater resistivity than other conductive materials, such as aluminum or tungsten, that are deposited on the work function metals and fill a predominant portion of the electrode-shaped recessed region. While a horizontal portion of the work function metal portion contacting a top surface of a high-k gate dielectric is required in order to adjust threshold voltage of the replacement gate MOSFET, vertical portions of the work function metal portion located on sidewalls of a gate electrode and laterally surrounding the other conductive material merely increase the resistance of the gate electrode.

Therefore, there remains a need to provide a MOSFET structure having a high performance replacement gate structure with reduced gate-contact parasitic capacitance.

SUMMARY

The present disclosure provides a method of forming a gate structure of a semiconductor device with reduced gate-contact parasitic capacitance. In a replacement gate scheme, a high-k gate dielectric layer is deposited on a bottom surface and sidewalls of a gate cavity. A metal cap layer and a sacrificial cap layer are deposited sequentially over the high-k gate dielectric layer to form a material stack. After ion implantation into vertical portions of the sacrificial cap layer, at least part of the vertical portions of the material stack can be removed. The subsequent removal of a remaining portion of the sacrificial cap layer provides a gate component structure. The vertical portions of the gate component structure do not extend to a top of the gate cavity, thereby significantly reducing gate-contact parasitic capacitance.

In one aspect of the present disclosure, a method of forming a semiconductor structure is provided. The method of the present disclosure includes first forming a gate cavity laterally surrounded by a planarization dielectric material layer on a semiconductor substrate. A top surface of the semiconductor substrate is exposed at a bottom of said gate cavity. A U-shaped high-k gate dielectric layer having a dielectric constant greater than 3.9, a U-shaped metal cap layer and a sacrificial cap layer are then formed in the gate cavity. Next, ions are implanted into vertical portions of the U-shaped sacrificial cap layer to damage at least part of the vertical portions of the U-shaped sacrificial cap layer. The damaged portions of said U-shaped sacrificial cap layer are then removed to expose portions of the U-shaped metal cap layer located directly beneath the damaged portions of the U-shaped sacrificial cap layer. Next, the exposed portions of the U-shaped metal cap layer are removed to expose portions of the U-shaped high-k gate dielectric layer located directly beneath the exposed portions of the U-shaped metal cap layer. Next, a remaining portion of the sacrificial cap layer is removed.

In another aspect of the present disclosure, a semiconductor structure is provided. The semiconductor structure of the present disclosure includes a gate stack and a planarization dielectric material layer. The gate stack includes a gate component structure and a gate electrode. The gate component structure includes a high-k gate dielectric having a horizontal portion and vertical portions, and a metal cap disposed on the high-k gate dielectric. The planarization dielectric material layer contacts sidewalls of the gate electrode and the vertical portions of the high-k gate dielectric.

DETAILED DESCRIPTION

Figure 1:
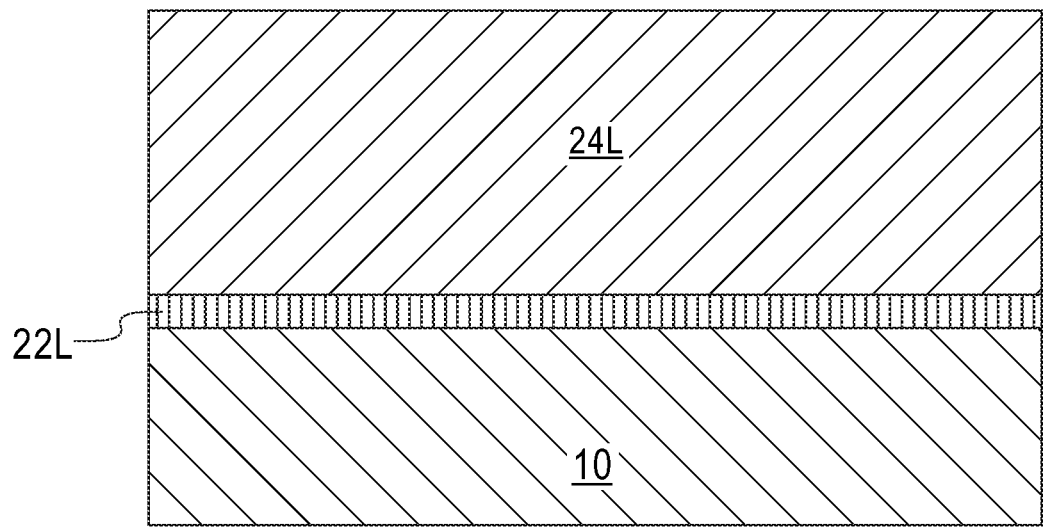
FIG. 1 is a cross-sectional view of an exemplary semiconductor structure including disposable gate level layers located on a semiconductor substrate in accordance with an embodiment of the present disclosure.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It is observed that although the following description and drawings show the presence of a single high-k gate dielectric/metal-containing conductor MOSFET, the present disclosure is not limited to the same. Instead, a plurality of high-k gate dielectric/metal-containing conductor MOSFETs can be formed utilizing the method of the present disclosure. The plurality of high-k gate dielectric/metal-containing conductor MOSFETs that can be formed may all have the same conductivity (i.e., nMOSFETs or pMOSFETs). Alternatively, the plurality of high-k gate dielectric/metal-containing conductor MOSFETs can include a first set of MOSFETs having a first conductivity (nMOSFETs or pMOSFETs) and a second set of MOSFETs having a second conductivity that differs from the first conductivity type MOSFET.

Referring to FIG. 1, there is illustrated an exemplary semiconductor structure according to an embodiment of the present disclosure that includes a material stack of disposable gate level layers 22L, 24L located on a surface of a semiconductor substrate 10.

In some embodiments of the present disclosure and as shown in FIG. 1, the semiconductor substrate 10 is a bulk semiconductor substrate. The bulk semiconductor substrate can be composed of any semiconductor material including, but not limited to, Si, Ge, SiGe, SiC, SiGeC, InAs, GaAs, InP, or other like III/V compound semiconductors. Multilayers of these semiconductor materials can also be used as the semiconductor material of the bulk semiconductor. In one embodiment, the semiconductor substrate 10 may comprise a single crystalline semiconductor material, such as, for example, single crystalline silicon. In other embodiments, the semiconductor substrate 10 may comprise a polycrystalline or amorphous semiconductor material.

In another embodiment, a semiconductor-on-insulator (SOI) substrate (not specifically shown) is employed as the semiconductor substrate 10. When employed, the SOI substrate includes a handle substrate, a buried insulating layer located on an upper surface of the handle substrate, and a semiconductor layer located on an upper surface of the buried insulating layer. The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP, or other like III/V compound semiconductors. Multilayers of these semiconductor materials can also be used as the semiconductor material of the handle substrate and the semiconductor layer. In one embodiment, the handle substrate and the semiconductor layer are both comprised of silicon. In another embodiment, hybrid SOI substrates are employed which have different surface regions of different crystallographic orientations.

The handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present disclosure. The handle substrate and/or the semiconductor layer of the SOI substrate may be a single crystalline semiconductor material, a polycrystalline material, or an amorphous material. Typically, at least the semiconductor layer is a single crystalline semiconductor material.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor layer of the SOI substrate is typically from 100 Å to 1000 Å, with a thickness from 500 Å to 700 Å being more typical. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above.

The buried insulating layer of the SOI substrate typically has a thickness from 10 Å to 2000 Å, with a thickness from 1000 Å to 1500 Å being more typical. The thickness of the handle substrate of the SOI substrate is inconsequential to the present disclosure.

In some other embodiments, hybrid semiconductor substrates which have different surface regions of different crystallographic orientations can be employed as semiconductor substrate 10. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 10 may be doped, undoped or contain doped and undoped regions therein. For clarity, the doped regions are not specifically shown in the drawings of the present disclosure. Each doped region within the semiconductor substrate 10 may have the same, or they may have different conductivities and/or doping concentrations. The doped regions that are present in the semiconductor substrate 10 are typically referred to as well regions and they are formed utilizing a conventional ion implantation process or gas phase doping.

The semiconductor substrate 10 can be processed to include at least one isolation region therein. For clarity, the at least one isolation region is not shown in the drawings of the present disclosure. The at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. When present, the at least one isolation region provides isolation between neighboring gate structure regions, typically required when the neighboring gates have opposite conductivities, i.e., nFETs and pFETs. As such, the at least one isolation region separates an nFET device region from a pFET device region.

A material stack of disposable gate level layers is deposited over the semiconductor substrate 10 as blanket layers, i.e., as unpatterned contiguous layers. The disposable gate level layers can include, for example, a vertical stack of a disposable gate dielectric layer 22L and a disposable gate material layer 24L. In some embodiments of the present disclosure, the disposable gate dielectric layer 22L can be omitted. When present, the disposable gate dielectric layer 22L includes a dielectric material such as a semiconductor oxide. In one embodiment, the disposable gate dielectric layer 22L can be a layer of silicon oxide, silicon nitride, or silicon oxynitride. The thickness of the disposable gate dielectric layer 22L can be from 1 nm to 10 nm, although lesser and greater thicknesses can also be employed. The disposable gate material layer 24L includes a material that can be subsequently removed selective to the dielectric material of a planarization dielectric material layer to be subsequently formed. For example, the disposable gate material layer 24L can include a semiconductor material such as polysilicon or a silicon-containing semiconductor alloy such as a silicon-germanium alloy. In some embodiments, the disposable containing material layer 24L may be a metal. The thickness of the disposable gate material layer 24L can be from 20 nm to 300 nm, although lesser and greater thicknesses can also be employed. While the present disclosure is illustrated with disposable gate level layers including a vertical stack of a disposable gate dielectric layer 22L and a disposable gate material layer 24L, any other disposable gate level layers can also be employed provided that the material(s) in the disposable gate level layers can be removed selective to a planarization dielectric material layer to be subsequently formed.

Figure 2:
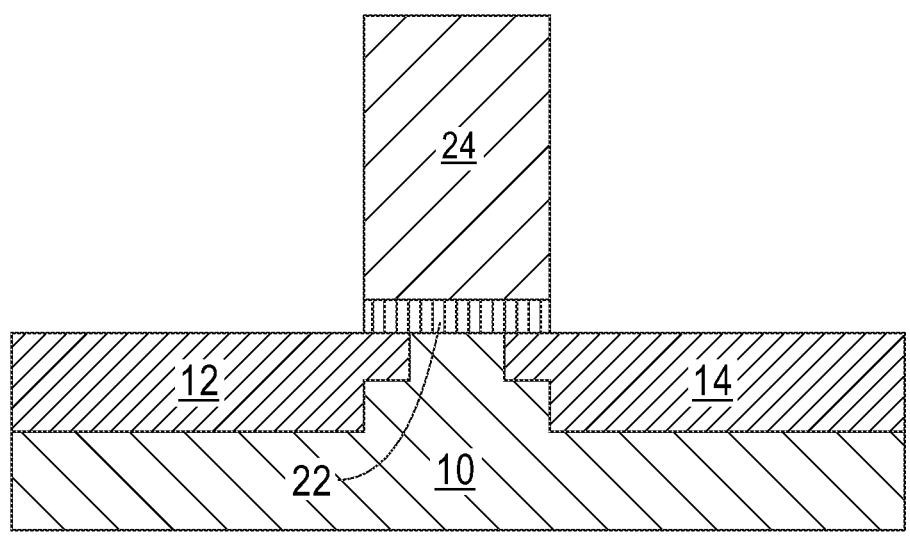
FIG. 2 is a cross-sectional view of the exemplary semiconductor structure of FIG. 1 after formation of a disposable gate structure and formation of source/drain regions.

Referring to FIG. 2, the disposable gate level layers (24L, 22L) are lithographically patterned to form a disposable gate structure. Specifically, a photoresist (not shown) is applied over the topmost surface of the disposable gate level layers (24L, 22L) and is lithographically patterned by lithographic exposure and development. The pattern in the photoresist is transferred into the disposable gate level layers (24L, 22L) by an etch, which can be an anisotropic etch such as a reactive ion etch. The remaining portions of the disposable gate level layers (24L, 22L) after the pattern transfer constitute a disposable gate structure (22, 24). The remaining portion of the disposable gate dielectric layer 22L is referred to herein as disposable gate dielectric portion 22, while the remaining portion of the disposable gate material layer 24L is referred to herein as a disposable gate material portion 24.

Source and drain extension implantation can then performed to form source and drain extension regions, which are laterally protruding portions of a source region 12 and a drain region 14 that contact the disposable gate dielectric portion 22. Spacer (not drawn) can be formed before the extension implantation. Deep source and drain implantation is then performed to complete formation of the source region 12 and the drain region 14, which include the source and drain extension regions, respectively, at the end of the deep source and drain implantation.

In some embodiments (not shown), the source and drain regions 12, 14 can be formed by replacement of the semiconductor material in the semiconductor substrate 10 with a new semiconductor material having a different lattice constant than the remaining portion of the semiconductor substrate 10. In this case, the new semiconductor material is typically epitaxially aligned with single crystalline semiconductor material of the semiconductor substrate 10, and applies a compressive stress or a tensile stress to the semiconductor material of the semiconductor substrate 10 between the source and drain extension regions 12, 14.

Figure 3:
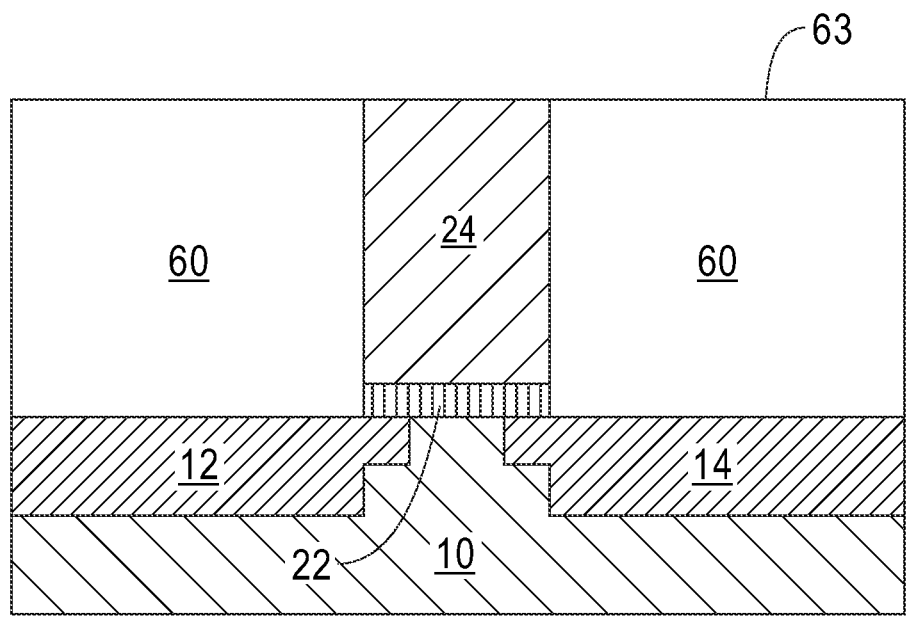
FIG. 3 is a cross-sectional view of the exemplary semiconductor structure of FIG. 2 after deposition and planarization of a planarization dielectric material layer.

Referring to FIG. 3, a planarization dielectric material layer 60 is deposited over the substrate 10, the disposable gate structure (22, 24) and the source and drain regions 12, 14. The planarization dielectric material layer 60 is generally a dielectric material that may be easily planarized. For example, the planarization dielectric material layer 60 can be a doped silicate glass, an undoped silicate glass (silicon oxide), an organosilicate glass (OSG), or a porous dielectric material. In one embodiment, the planarization dielectric material layer 60 can include a porous or non-porous low dielectric constant (low-k) material having a dielectric constant less than 2.7. The planarization dielectric material layer 60 is subsequently planarized above the topmost surfaces of the disposable gate structure (22, 24). The planarization can be performed, for example, by chemical mechanical planarization (CMP). The planar topmost surface of the planarization dielectric material layer 60 is herein referred to as a planar dielectric surface 63. The topmost surface of the disposable gate structure (22, 24) is coplanar with the planar dielectric surface 63 of the planarization dielectric material layer 60 after the planarization.

Figure 4:
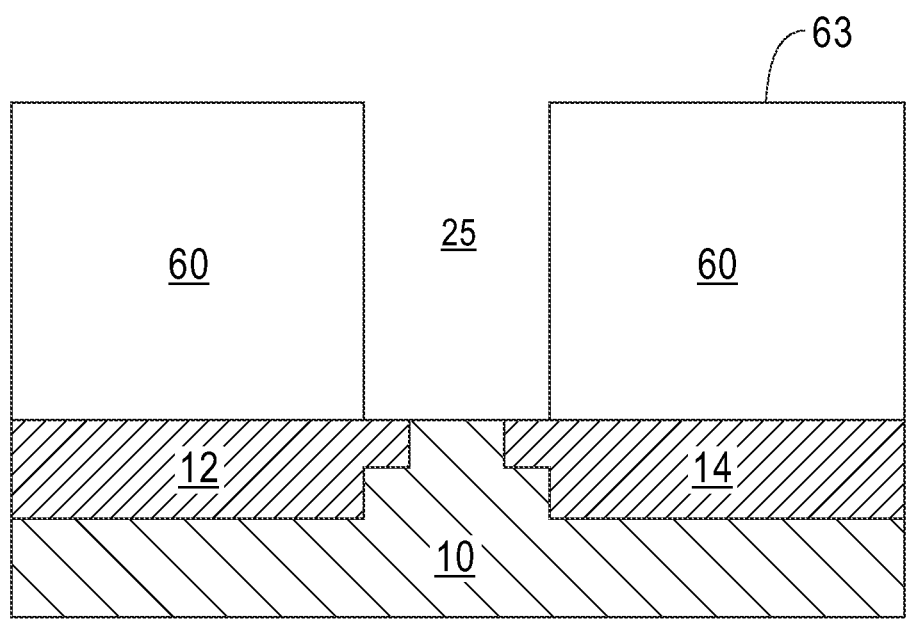
FIG. 4 is a cross-sectional view of the exemplary semiconductor structure of FIG. 3 after removal of the disposable gate structure.

Referring to FIG. 4, the disposable gate structure (22, 24) is removed selective to the planarization dielectric material layer 60 by at least one etch. The at least one etch can be a recess etch, which can be an isotropic etch or anisotropic etch. In one embodiment, the removal of the disposable gate structure (22, 24) is effected by a first isotropic or anisotropic etch that removes the material of the disposable gate material portion 24 while not removing the materials of the planarization dielectric material layer 60, followed by a second isotropic or anisotropic etch that removes the disposable dielectric portion 22 while not removing the planarization dielectric material layer 60. A recessed region, which is herein referred to as a gate cavity 25, is formed after removal of the disposable gate structure (22, 24). A portion of the top surface of the semiconductor substrate 10 is exposed within the gate cavity 25. The gate cavity 25 is laterally confined by inner sidewalls of the planarization dielectric material layer 60.

Figure 5:
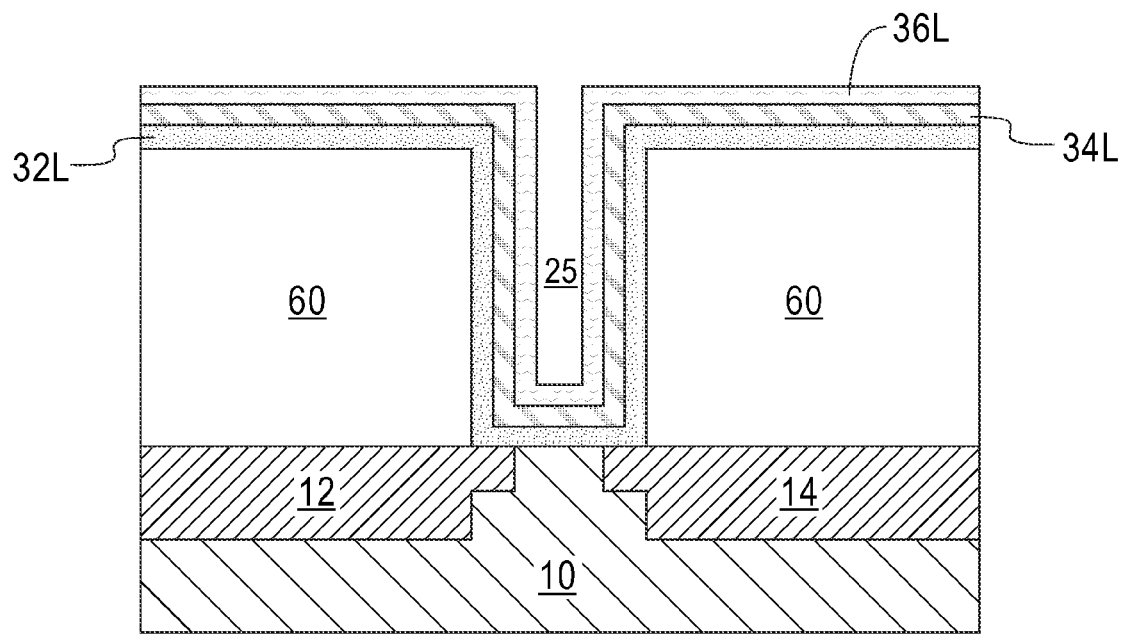
FIG. 5 is a cross-sectional view of the exemplary semiconductor structure of FIG. 4 after formation of a high-k gate dielectric layer, a metal cap layer and a sacrificial cap layer.

Referring to FIG. 5, a high-k gate dielectric layer 32L is deposited on the bottom surface and sidewalls of the gate cavity 25 and the topmost surface of the planarization dielectric material layer 60. The high-k gate dielectric layer 32L can comprise any dielectric material having a dielectric constant greater than 3.9, typically greater than 7.0. Examples of such high-k gate dielectric materials include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The thickness of the high-k gate dielectric layer 32L, as measured at horizontal portions, can be from 0.9 nm to 6 nm, and typically from 1.0 nm to 3 nm. The high-k gate dielectric layer 32L may have an effective oxide thickness on the order of or less than 2 nm. In one embodiment, the high-k gate dielectric layer 32L is a $HfO_2$ layer having a thickness of 2 nm. The high-k gate dielectric layer 32L can be formed by a conventional deposition process, including but not limited to, atomic layer deposition (ALD), chemical vapor deposition (CVD), low-pressure chemical vapor deposition (LPCVD), plasma enhanced chemical vapor deposition (PECVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, ion beam deposition, electron beam deposition, and laser assisted deposition.

A metal cap layer 34L is formed on the high-k gate dielectric layer 32L. In one embodiment, the metal cap layer 34L is composed of TiN, TiSiN, TaN, TaSiN, TiTaN, TaRuN, WN, WSiN, or combinations thereof. The metal cap layer 34L may be deposited by, for example, sputtering, plating, CVD, PVD, or ALD. In one embodiment, the metal cap layer 34L is composed of TiN and is deposited using sputtering. In one example, the metal cap layer 34L composed of TiN is sputtered from a solid titanium target, in which the nitrogen content of the metal nitride layer is introduced by a nitrogen gas. In another example, the metal cap layer 34L composed of TiN is sputtered from a solid target comprised of titanium and nitrogen. The metal cap layer 34L typically has a thickness ranging from 1 nm to 10 nm, with a thickness ranging from 2 nm to 5 nm being more typical. In one embodiment, the metal cap layer 34L is a TiN layer.

A sacrificial cap layer 36L is then formed on the metal cap layer 34L. In some embodiments of the present disclosure, the sacrificial cap layer 36L comprises a semiconductor material such as amorphous Si (a-Si) or SiGe. In other embodiments of the present disclosure, the sacrificial cap layer 36L may be comprised of a dielectric material such as $SiO_2$ and SiN. The sacrificial cap layer 36L may be formed using a deposition process, for example, low pressure CVD or room temperature CVD. The sacrificial cap layer typically has a thickness ranging from 1 nm to 10 nm. In one embodiment, the sacrificial cap layer 36 is an a-Si layer.

Figure 6:
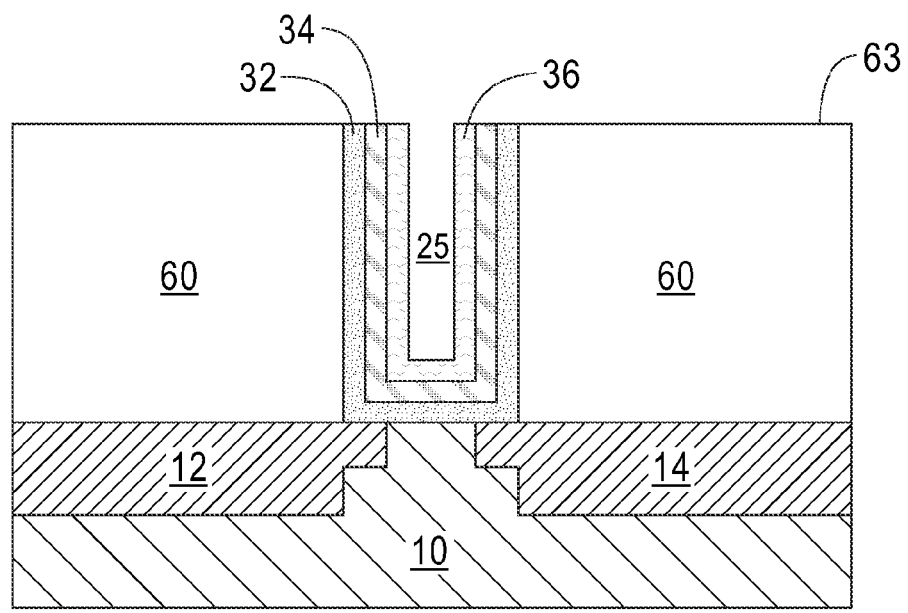
FIG. 6 is a cross-sectional view of the exemplary semiconductor structure of FIG. 5 after formation of a U-shaped high-k gate dielectric layer, a U-shaped metal cap layer and a U-shaped sacrificial cap layer.

Referring to FIG. 6, portions of the high-k gate dielectric layer 32L, the metal cap layer 34L and the sacrificial cap layer 36L are removed from above the planar dielectric surface 63 by employing a planarization process, resulting in a U-shaped high-k gate dielectric layer portion 32, a U-shaped metal cap layer portion 34, and a U-Shaped sacrificial cap layer portion 36 formed within the gate cavity 25. As such, uppermost surfaces of each of the U-shaped high-k gate dielectric layer portion 32, the U-shaped metal cap layer portion 34, and the U-Shaped sacrificial cap layer portion 36 are coplanar with the planar dielectric surface 63 of the planarization dielectric material layer 60 after the planarization.

Figure 7:
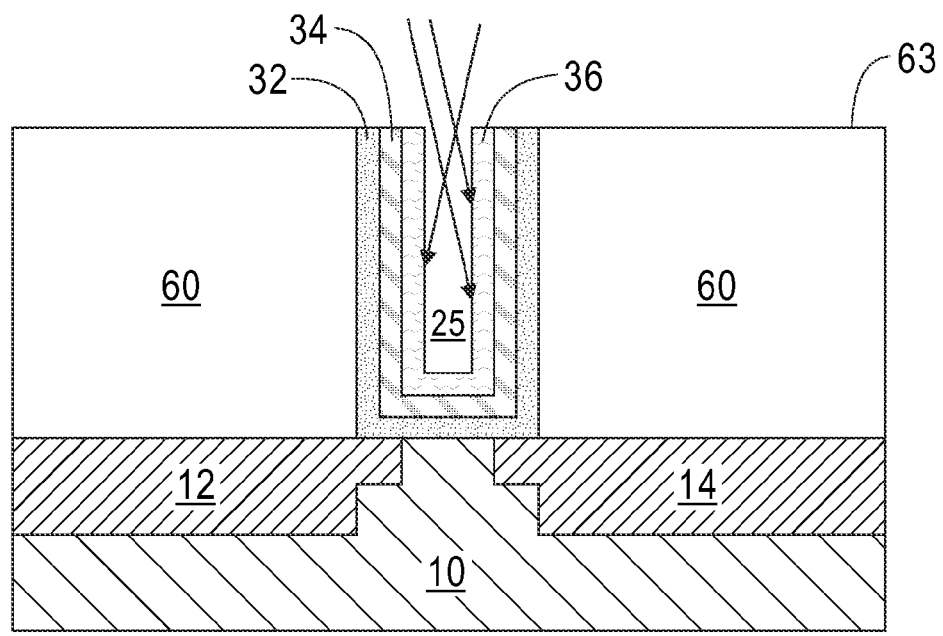
FIG. 7 is a cross-sectional view of the exemplary semiconductor structure of FIG. 6 illustrating ion implantation into vertical portions of the U-shaped sacrificial cap layer.

Referring to FIG. 7, vertical portions of the U-shaped sacrificial cap layer portion 36 are implanted with ions. The implantation is conducted at an angle that is not perpendicular to the horizontal portion of the U-shaped sacrificial cap layer portion 36 (e.g., less than 90°) to damage at least part of the vertical portions of the U-shaped sacrificial cap layer portion 36, while the horizontal portion of the U-shaped sacrificial cap layer portion 36 is left intact, i.e., undamaged. The incident angle of the ion implantation is typically from 45° to 85°. The implantation energy and dosage of the ion species can be adjusted to obtain a desired damage depth. Typically, the implantation uses a dosage ranging from $1\times10^{15}$ atoms/cm$^2$ to $5\times10^{17}$ atoms/cm$^2$ with an energy from 1 keV to 30 keV. Other parameters can also be used in the present application. In one embodiment, the damage depth is substantially the same as the thickness of the vertical portions of the sacrificial cap layer portion 36. The ion species used in the implantation process can be one or more of the following: oxygen, argon, helium, neon, and xenon. In some embodiments, sputtering using argon at an angle that is not perpendicular to the horizontal portion of the U-shaped sacrificial cap layer portion 36 may be used to damage part of the vertical portions of the sacrificial cap layer portion 36. In one embodiment, implantation is carried out with oxygen ions and with implantation energy of 5 keV and an implantation dosage in a range from $1\times10^{16}$-$5\times10^{17}$ atoms/cm$^2$. For a large gate cavity 25 having a width larger than 30 nm, the horizontal portion and lower portion of the vertical portions of the U-shaped sacrificial cap portion 36 may be masked (not shown) before the ion implantation to prevent the damage to the horizontal portion of the U-shaped sacrificial cap layer portion 36.

Figure 8:
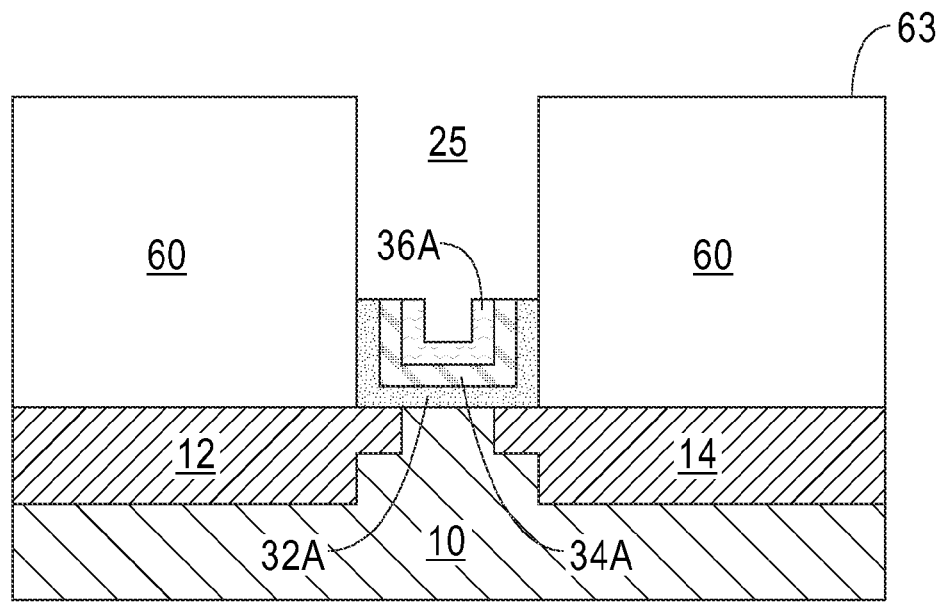
FIG. 8 is a cross-sectional view of the exemplary semiconductor structure of FIG. 7 after removal of part of the vertical portions of the U-shaped sacrificial cap layer that is damaged by ion implantation, and parts of the U-shaped metal cap layer and the U-shaped high-k gate dielectric layer located beneath the damaged part of the U-shaped sacrificial cap layer.

Referring to FIG. 8, the damaged portions of the U-shaped sacrificial cap layer portion 36 as well as vertical portions of the U-shaped metal cap layer portion 34 and the U-shaped high-k gate dielectric layer portion 32 located beneath the damaged portions of the U-shaped sacrificial cap layer portion 36 are removed by at least one directional etching process. The remaining portions of the U-shaped high-k gate dielectric layer portion 32, the U-shaped metal cap layer portion 34 and the U-shaped sacrificial cap layer portion 36 are herein referred as 32A, 34A, 36A, respectively. In one embodiment, and when the U-shaped sacrificial cap layer portion 36 is composed of an a-Si, the damaged portions of the U-shaped sacrificial cap layer portion 36 can be removed by a HF solution without substantially attacking the underlying metal cap layer portion 34.

The exposed portions of the U-shaped metal cap layer portion 34 are then removed selective to the U-shaped high-k gate dielectric layer portion 32. In one embodiment, and when the U-shaped metal cap layer portion 34 is composed of TiN, the exposed portions of the U-shaped metal cap layer portion 34 can be removed by a solution of $H_2SO_4$ and $H_2O_2$. In another embodiment, and when the U-shaped metal cap layer portion 34 is composed of TiN, the exposed portion of the U-shaped metal cap layer portion 34 can be removed utilizing a solution of $NH_4OH$, $H_2O_2$ and dionized water.

Finally, the exposed portions of the U-shaped high-k gate dielectric layer portion 32 are removed selective to the planarization dielectric material layer 60. In one embodiment, and when the U-shaped high-k gate dielectric layer portion 32 is composed of HfO$_2$, the exposed portions of the U-shaped dielectric layer portion 32 can be removed by a HF solution.

Figure 9:
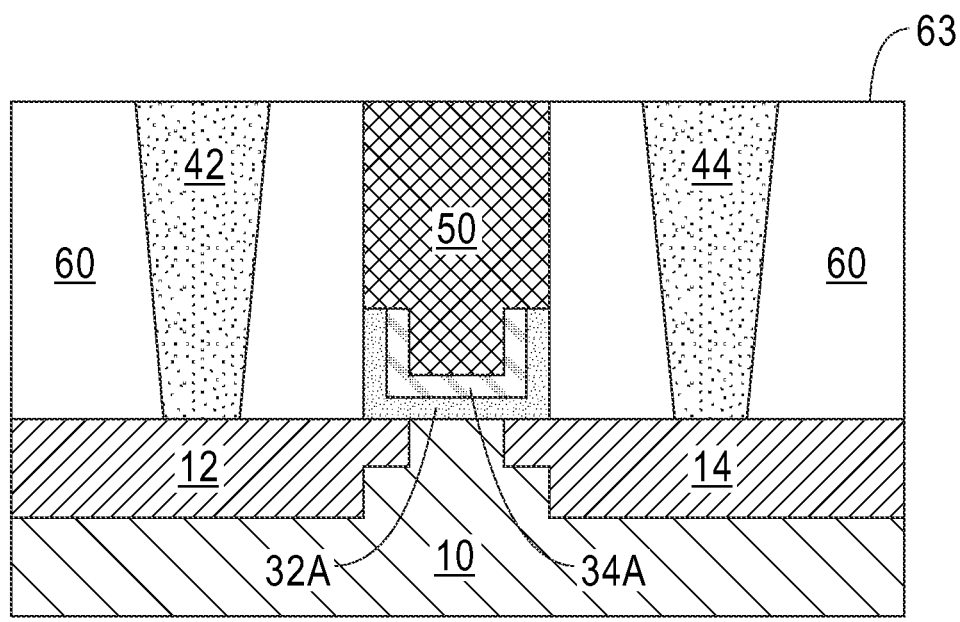
FIG. 9 is a cross-sectional view of the exemplary semiconductor structure of FIG. 8 after formation of a gate electrode and conductive via structures in accordance with an embodiment of the present disclosure.

Referring to FIG. 9, the remaining portion 36A of the U-shaped sacrificial cap layer portion 36 is removed by an etch selective to the remaining portion 34A of the U-shaped metal cap layer portion 34 to provide a gate component structure (32A, 34A).

A gate electrode is formed by depositing at least one conductive material in the gate cavity 25 to fill the remaining volume of the gate cavity 25. In one embodiment, the gate electrode includes a conductive metal portion 50. The conductive metal portion 50 is formed utilizing a conventional deposition process such as, for example, ALD, CVD, MOCVD, MBE, PVD, sputtering, plating, evaporation, ion beam deposition, electron beam deposition, laser assisted deposition, and chemical solution deposition. The conductive metal portion 50 includes a conductive metal such as, but not limited to Al, W, Cu, Pt, Ag, Au, Ru, Ir, Rh and Re, alloys of a conductive metal, e.g., Al—Cu, silicides of a conductive metal, e.g., W silicide, and Pt silicide, or combinations thereof.

Contact via structures are formed in the planarization dielectric material layer 60 utilizing conventional techniques well known to those skilled in the art. In one embodiment, the contact via structures can be formed by lithography, etching and filling the opening provided by the etch with a contact metal such as, for example, Al, W and/or Cu. The contact via structures may include a source-side contact via structure 42 and a drain-side contact via structure 44.

Figure 10:
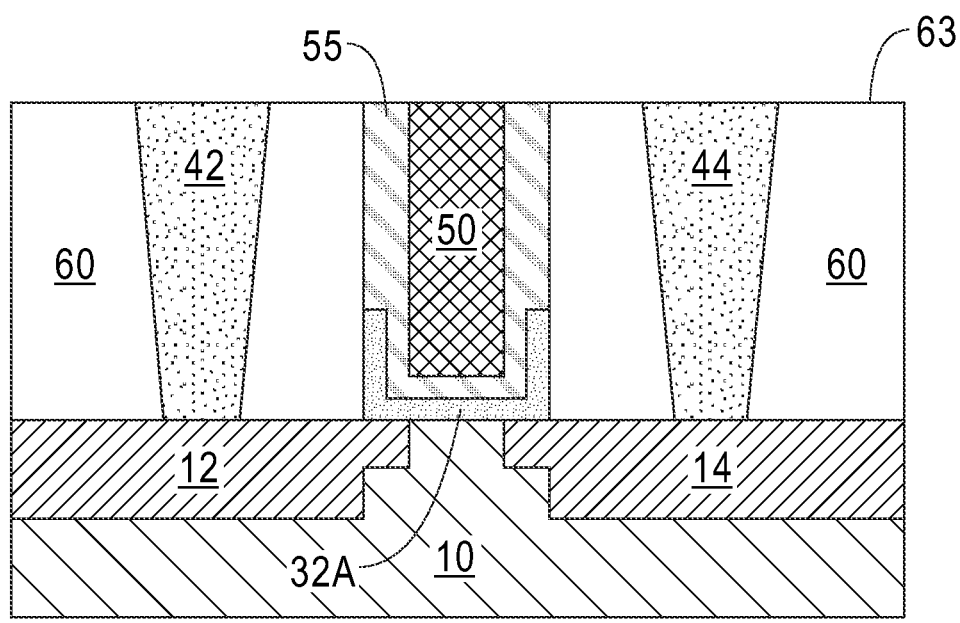
FIG. 10 is a cross-sectional view of the exemplary semiconductor structure of FIG. 8 after formation of a gate electrode and conductive via structures in accordance with another embodiment of the present disclosure.

Referring to FIG. 10, and in another embodiment, the gate electrode includes a work function metal portion 55 and a conductive metal portion 50. The material of the work function metal portion 55 is first deposited as a work function metal layer (not shown) directly on the exposed surfaces of the remaining portion 32A of the high-k gate dielectric layer portion 32 as well as the inner sidewalls of the planarization dielectric material layer 60. The material of the conductive metal portion 50 is then deposited as a conductive metal layer (not shown) directly on the exposed surfaces of the work function metal layer (not shown) to fill a remaining volume of the gate cavity 25. Typically, the work function metal portion 55 can be composed of a material same as, or different from the metal cap layer portion 34. Suitable materials for work function metal portion 55 include TiNi, TaC, TaNC, and Ru. In one embodiment, the work function metal portion 55 is composed of TiN.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
   forming a gate cavity laterally surrounded by a planarization dielectric material layer on a semiconductor substrate, wherein a top surface of said semiconductor substrate is exposed at a bottom of said gate cavity;
   forming a U-shaped high-k gate dielectric layer having a dielectric constant greater than 3.9, a U-shaped metal cap layer and a sacrificial cap layer in said gate cavity;
   implanting ions into vertical portions of said U-shaped sacrificial cap layer to damage at least part of said vertical portions of said U-shaped sacrificial cap layer;
   removing said damaged portions of said U-shaped sacrificial cap layer to expose portions of said U-shaped metal cap layer located directly beneath said damaged portions of said U-shaped sacrificial cap layer;
   removing said exposed portions of said U-shaped metal cap layer to expose portions of said U-shaped high-k gate dielectric layer located directly beneath said exposed portions of said U-shaped metal cap layer;
   removing said exposed portions of said U-shaped high-k gate dielectric layer; and
   removing a remaining portion of said sacrificial cap layer.

2. The method of claim 1, wherein an incident angle of said implanting is controlled so as to leave a horizontal portion of said sacrificial cap layer intact.

3. The method of claim 2, wherein said implanting utilizes ions selected from the group consisting of oxygen, argon, helium, neon, and xenon.

4. The method of claim 3, wherein said implanting uses a dosage ranging from $1 \times 10^{16}$ atoms/cm$^2$ to $5 \times 10^{17}$ atoms/cm$^2$ with an energy from 1 keV to 30 keV.

5. The method of claim 1, wherein said U-shaped metal cap layer comprises titanium nitride (TiN), titanium silicon nitride (TiSiN), tantalum nitride (TaN), tantalum silicon nitride (TaSiN), titanium tantalum nitride (TiTaN), tantalum ruthenium (TaRuN), tungsten nitride (WN), tungsten silicon nitride (WSiN), or combinations thereof.

6. The method of claim 1, wherein said U-shaped sacrificial cap layer comprises a semiconductor material or a dielectric material.

7. The method of claim 6, wherein said U-shaped sacrificial cap layer comprises amorphous silicon or silicon germanium (SiGe).

8. The method of claim 6, wherein said U-shaped sacrificial cap layer comprises silicon oxide (SiO$_2$) or silicon nitride (SiN).

9. The method of claim 1, wherein a dielectric material of said high-k gate dielectric layer comprises hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

10. The method of claim 1, further comprising forming a gate electrode to fill a recess region of said gate cavity after removing said remaining portion of said U-shaped sacrificial cap layer.

11. The method of claim 10, wherein said gate electrode comprises a conductive metal portion made of a conductive metal selected from the group consisting of Al, W, Cu, Pt, Ag, Au, Ru, Ir, Rh, Re, alloys thereof, and silicides thereof.

12. The method of claim 10, wherein said gate electrode comprises a work function metal portion and a conductive metal portion.

13. The method of claim 12, wherein said work function metal portion comprises titanium nitride (TiN), tantalum nitride (TaN), titanium silicon nitride (TiSiN), tantalum silicon nitride (TaSiN), titanium carbide (TiC), tantalum carbide (TaC, Ta$_2$C), tungsten nitride (WN), and combinations thereof, and wherein, the conductive metal portion comprises W, Cu, Pt, Ag, Au, Ru, Ir, Rh, Re, alloys thereof, or silicides thereof.

14. The method of claim 1, further comprising:
   forming a disposable gate structure on said semiconductor substrate;

forming and planarizing a planarization dielectric material layer on said semiconductor substrate, wherein a top surface of said planarization dielectric material layer is coplanar with a top surface of said disposable gate structure;

recessing said disposable gate structure to form said gate cavity over said semiconductor substrate prior to forming said U-shaped high-k gate dielectric layer.

\* \* \* \* \*